United States Patent [19]
Haas, Jr. et al.

[11] Patent Number: 5,392,185
[45] Date of Patent: Feb. 21, 1995

[54] ELECTROSTATIC DISCHARGE PROTECTION DEVICE

[75] Inventors: Glen R. Haas, Jr., Plano; Thomas E. Nagle, Dallas, both of Tex.

[73] Assignee: Texas Instruments Incorporated, Dallas, Tex.

[21] Appl. No.: 890,899

[22] Filed: May 29, 1992

[51] Int. Cl.$^6$ ............................................. H02H 9/04
[52] U.S. Cl. ....................................... 361/56; 361/91; 361/111
[58] Field of Search .................... 361/56, 58, 111, 91; 257/12, 173, 200, 197

[56] References Cited

U.S. PATENT DOCUMENTS

| | | | |
|---|---|---|---|
| 4,930,036 | 5/1990 | Sitch | 361/56 |
| 4,939,562 | 7/1990 | Adlerstein | 357/34 |
| 5,012,317 | 4/1991 | Rountre | 361/56 |

OTHER PUBLICATIONS

S. M. Sze, *Physics of Semiconductor Devices*, 2nd edition, Chapter 4, John Wiley and Sons, New York, 1981.

*Primary Examiner*—Marc S. Hoff
*Assistant Examiner*—S. Jackson
*Attorney, Agent, or Firm*—Michael K. Skrehot; James C. Kesterson; Richard L. Donaldson

[57] ABSTRACT

In one form of the invention, an Electrostatic Discharge protection device containing at least one heterojunction transistor is disclosed. In another embodiment, an Electrostatic Discharge protection circuit comprises: a first terminal contact 20; an NPN heterojunction bipolar transistor Q2; a PNP bipolar transistor Q1; a base-emitter shunt resistor R2; an emitter of said PNP transistor connected to said first terminal contact; a base of said PNP transistor connected to collector of said NPN transistor; a collector of said PNP transistor connected to a base of said NPN transistor; and an emitter of said NPN transistor connected to a second terminal contact 22, with said base-emitter shunt resistor connected between said base of said NPN transistor and an emitter of said NPN transistor, whereby a low-capacitance device capable of protecting semiconductor devices from electrostatic discharges in excess of 4000 Volts results. Other devices, systems, and methods are also disclosed.

29 Claims, 8 Drawing Sheets

ELECTROSTATIC DISCHARGE PROTECTION DEVICE

NOTICE

© Copyright, *M* Texas Instruments Incorporated 1992. A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise rescues all copyright and mask work fights whatsoever.

FIELD OF THE INVENTION

This invention relates generally to Electrostatic Discharge protection devices.

BACKGROUND OF THE INVENTION

Without limiting the scope of the invention, its background is described in connection with devices for protection against Electrostatic Discharge.

Heretofore in this field semiconductor devices have been known to be susceptible to the Electrostatic Discharge (ESD) phenomenon. The best known ESD events are those generated between the human body and ground. Electrostatic potentials of 4 kV are not uncommon. Typically, the discharge occurs within a few tens of nanoseconds and generates peak currents in the tens of amperes. This surge of high-voltage, high-current electricity represents a major threat to electronic components. Past solutions to the protection of semiconductor devices from ESD have typically relied on Si clamping diodes, Zener diodes, and Silicon-controlled rectifiers, or thyristors.

SUMMARY OF THE INVENTION

The aforementioned solutions have significant limitations when ESD protection is desired for GaAs integrated circuits. Additionally, the use of discrete Si protection devices in radio frequency (RF) applications results in degraded circuit performance due to the relatively high capacitance and slow switching speeds of the aforementioned Si devices.

Therefore, there is a need in the semiconductor industry for a low-capacitance, high-speed device that may be integrated onto monolithic GaAs integrated circuits and for discrete protection devices, especially in radio frequency (RF) applications.

It is herein recognized that a need exists for a GaAs ESD protection device. Specifically, it is desired that the device have the characteristics of low-capacitance, high switching speed, and preferably also integrability with GaAs monolithic integrated circuits. Because of the epitaxial material growth required, heterojunction devices have generally been considered as very expensive devices and justified only in very high performance applications; however, it has been found that such devices allow the implementation of very small circuits in ESD applications and that this small size provides for reasonably priced circuits.

Generally, and in one form of the invention, an ESD protection circuit comprising at least one heterojunction bipolar transistor is disclosed.

This is apparently the first ESD protection device to be fabricated in a predominantly GaAs material system. It is also apparently the first example of the use of heterojunction bipolar transistors in an ESD protection circuit. An advantage of the invention is that its capacitance is approximately an order-of-magnitude lower than a comparable silicon-controlled rectifier, and its switching speed is much faster. In addition, it is easily integrable on GaAs monolithic integrated circuits. Further, such a configuration has been demonstrated to provide ESD protection in excess of 4000 Volts.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 4:
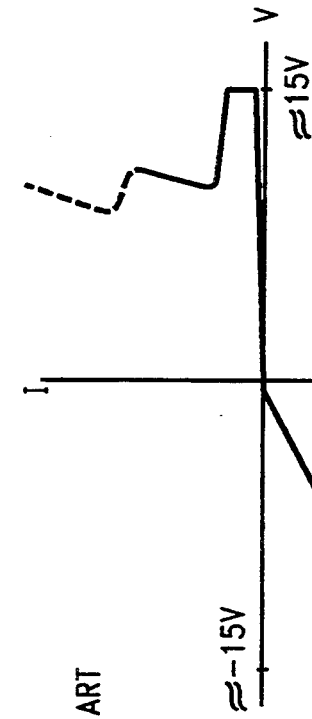
FIG. 4 is a plot of the I-V characteristics of the typical prior art device of FIG. 3.
Figure 3:
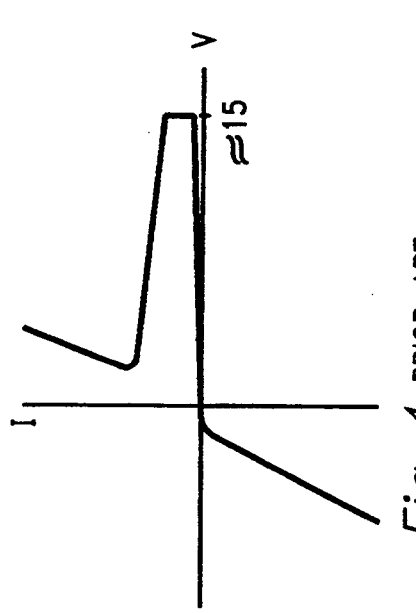
FIG. 3 is a schematic diagram of a typical prior art device.
Figure 1:
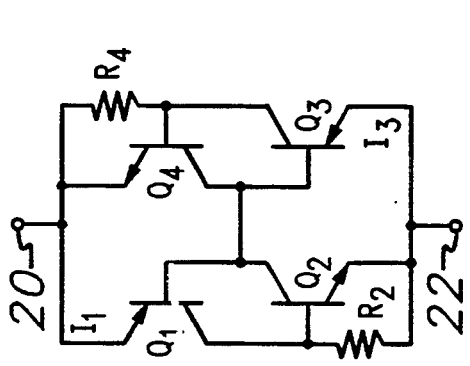
FIG. 1 is a schematic diagram of the first preferred embodiment device.
Figure 2:
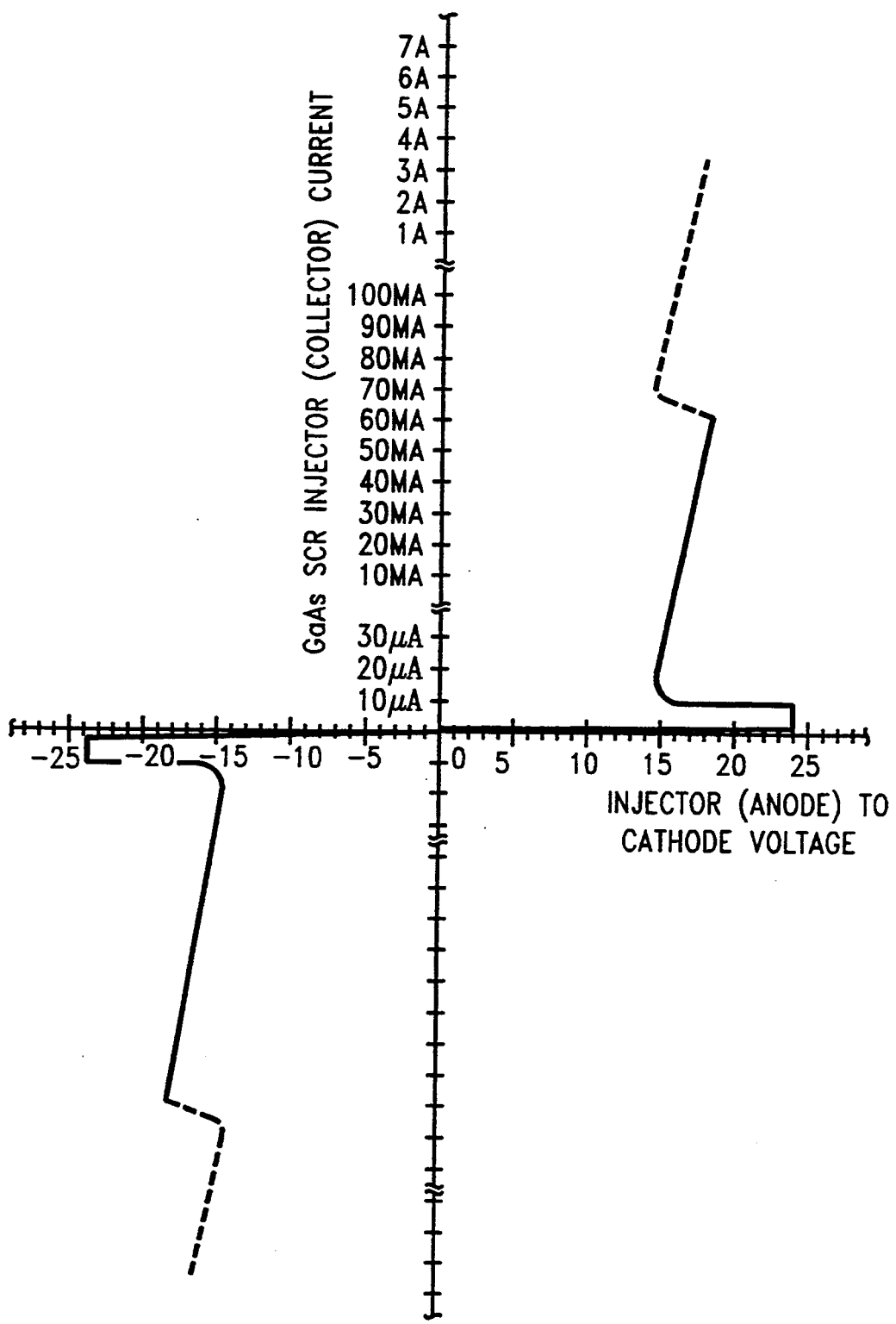
FIG. 2 is a plot of the I-V characteristics of the first preferred embodiment device.

A schematic diagram of the first preferred embodiment circuit is shown in FIG. 1. The circuit functions as a bi-directional GaAs semiconductor-controlled rectifier (SCR). It is comprised of two SCR subcircuits; one is made up of the Q1, Q2, and R2 combinations, while the other is comprised of the Q3, Q4, and R4 elements. The Q1, Q2, and R2 subcircuit protects against positive ESD voltage transients, while the Q3, Q4, and R4 subcircuit protects against negative ESD voltage transients. When combined as shown in FIG. 1, they form a bi-directional (i.e. positive or negative) ESD protection device. It should be noted that an important feature of the present invention is that its bi-directionality applies not only to its ability to protect against Electrostatic Discharge events, but that it also allows voltage swings of either polarity up to approximately ±15–25 V before it reaches the $BV_{CER}$, or turn-on, voltage. A plot of the I-V characteristics of the first preferred embodiment device is shown in FIG. 2. This is in contrast to past ESD protection solutions that are usually "clamped" by a diode for negative transients. A circuit diagram of a typical prior art diode-clamped SCR is shown in FIG. 3. Reference to the I-V curve of the typical prior art device in FIG. 4 shows that while a forward voltage of 12 to 20 V can be tolerated before turn-on, only a diode voltage drop is required for the device to turn-on for negative voltages. The prior art solution is adequate for the protection of DC signal lines, because in normal operation the line voltage does not go below ground. However, for RF signal lines the protection device should allow for the equal (assuming device loading is equal for both polarities) positive and negative voltage swings of an RF waveform. As described above, the first preferred embodiment device allows for voltage swings of approximately ±15-25 V before it reaches the turn-on condition. The embodiment may be used as ESD protection on DC or RF signal lines or conductors. It is typically arranged with one node 20, for example, in connection with an RF or DC signal line, and the other node 22 in connection with a ground line. The embodiment is especially suited for integration in monolithic integrated circuits because of its very small size (approximately 100 $\mu$m square) and the ease of forming the device from epitaxial structures used to produce devices such as Heterojunction Bipolar Transistors (HBTs), Heterojunction Field Effect Transistors (HFETs), and Metal-semiconductor Field Effect Transistors (MESFETs).

Figure 6:
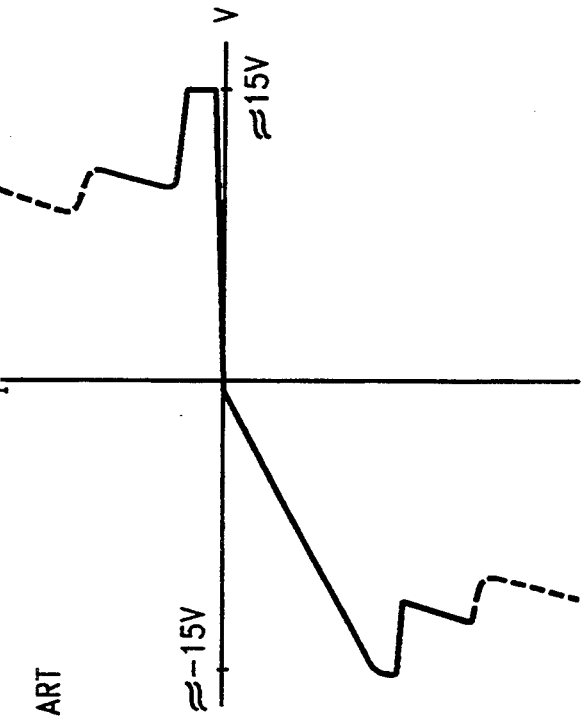
FIG. 6 is a plot of the I-V characteristics of the second preferred embodiment device.
Figure 5:
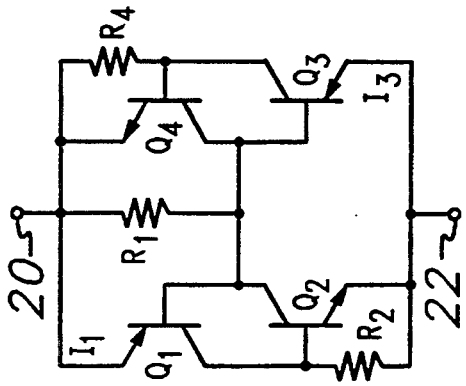
FIG. 5 is a schematic diagram of the second preferred embodiment device.

In a second preferred embodiment of the inventive device, the low negative turn-on voltage of the prior art solution can be obtained, while still retaining the higher voltage "snapback" characteristics observed for forward voltages in the first preferred embodiment device. This is accomplished by the addition of resistor R1, shown in the schematic of FIG. 5. Adding the resistor R1 maintains the bi-directional ESD protection characteristics of the first preferred embodiment device, but limits the protected circuit's operation to voltages between one diode voltage drop below ground to approximately ±15-25 V. This is an important feature for DC control lines where limiting negative voltage transients may be important.

Where the second preferred embodiment device differs from prior art solutions is that the SCR-like action evident in the forward I-V characteristics of the device will also occur in the negative I-V characteristic. Circuit function under negative voltage conditions will be described with reference to the schematic diagram of the second preferred embodiment circuit of FIG. 5, and its associated I-V characteristic shown in FIG. 6. The circuit has no effect on negative voltage swings of amplitude less than approximately 0.6 V. However, at approximately −0.6 V, the emitter-base junction "diode" of transistor Q3 turns on and a current is established through the emitter-base junction of Q3 and through resistor R1. The I-V curve then adopts a resistive slope similar to that seen in the prior art I-V characteristics until the current through R1 is sufficient to generate a voltage across R1 that exceeds the turn-on voltage of transistor Q4. At this point the current is shunted around R1 through Q4 and the circuit reverts to its normal SCR-like operation, with the associated advantage over the prior art solution of handling high currents at lower voltages, and therefore being able to dissipate higher energy transients.

The value of R1 sets the I-V characteristics for the transition point from the prior art "diode" I-V characteristic to the SCR-like "snapback" I-V characteristic of the second preferred embodiment device.

Figure 7:
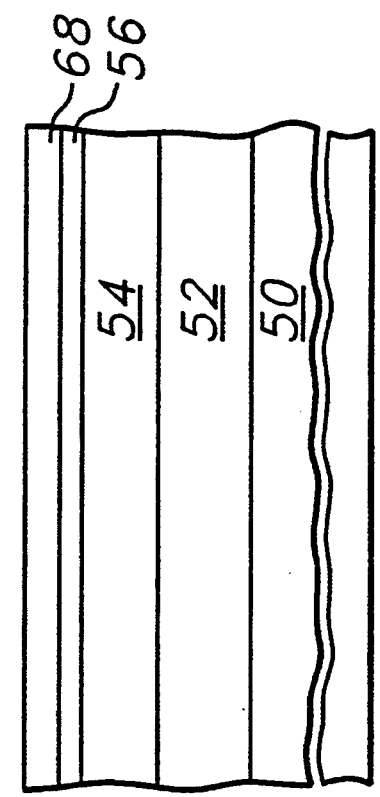
FIG. 7 is a cross-sectional view of the epitaxial material structure used in the fabrication of the preferred embodiment devices.
Figure 8A:
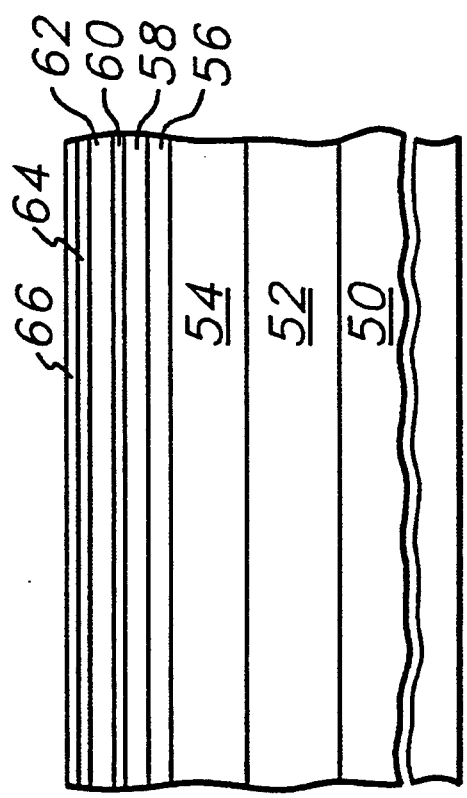
FIG. 8a–8f are cross-sectional views illustrating the process of fabrication of the first preferred embodiment process.

The epitaxial material structure of which the preferred embodiment devices are constructed is shown in FIG. 7. The substrate 50 is semi-insulating GaAs of a thickness of approximately 625 $\mu$m. An n-type GaAs subcollector layer 52 doped with Si for example to a concentration of about $1.5 \times 10^{18}$ cm$^{-3}$ is then deposited to a thickness of approximately 1.0 $\mu$m. The n-type collector layer 54 of GaAs, doped with Si for example to a concentration of about $8.0 \times 10^{15}$ cm$^{-3}$, is then deposited to a thickness of approximately 0.65 $\mu$m. Next, the p-type GaAs base layer 56, doped with C for example to a concentration of about $1.5 \times 10^{19}$ cm$^{-3}$ is deposited to a thickness of approximately 0.09 $\mu$m. The emitter layer 58, $Al_xGa_{1-x}As$, where x=0.30, doped with Si for example to a concentration of approximately $5 \times 10^{17}$ cm$^{-3}$ is deposited to a thickness of approximately 0.1 $\mu$m. In graded layer 60, the Al mole fraction is decreased from 30% at the top edge of the emitter layer 58 to 0% within a layer thickness of approximately 0.05 $\mu$m. Doping is the same as in emitter layer 58. On top of graded layer 58 is deposited buffer layer 62, comprised of GaAs and doped with Si for example to a concentration of about $4 \times 10^{18}$ cm$^{-3}$. The buffer layer 62 thickness is approximately 0.15 $\mu$m. The next layer serves as a transition between buffer layer 62 and emitter contact layer 69. In graded layer 64 the In mole fraction is graded from 0% at the top edge of buffer layer 62 to 50% over a thickness of approximately 0.04 $\mu$m. Graded layer 64 is doped with Si for example to a concentration of about $1 \times 10^{19}$ cm$^{-3}$. Finally, emitter contact layer 66 of $In_xGa_{1-x}As$, where x=0.50, doped with Si for example to a concentration of approximately $1 \times 10^{19}$ cm$^{-3}$ is deposited to a thickness of approximately 0.04 $\mu$m. For clarity, the epitaxial material structure of FIG. 7 will be represented in simplified form, as shown in FIG. 8a throughout the remainder of the process description. Layers 58, 60, 62, 64, and 66 are represented by a single layer 68 in FIG. 8a.

Figure 8B:
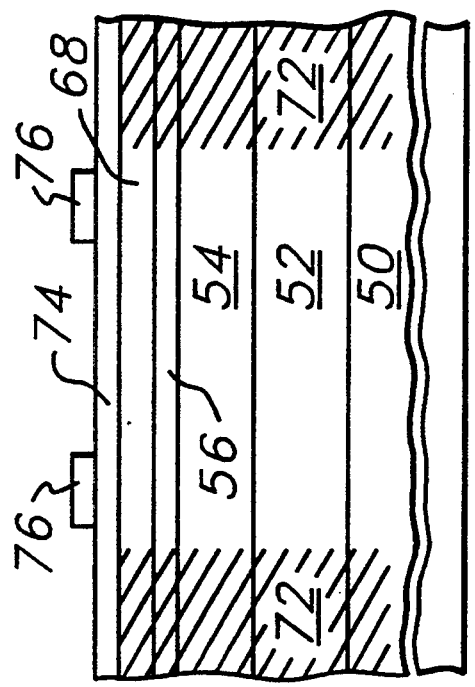

Fabrication of the first preferred embodiment device is described herein as follows. Patterned photoresist is used in an evaporation and liftoff procedure to deposit approximately 4.0 $\mu$m of Au 70 over an area that defines the active device region. The Au acts as a mask for an approximately 5 MeV $O_2$ implant which serves to isolate the active device region on the semiconductor wafer. The resulting structure is shown in FIG. 8b, where the isolated region 72 is shown shaded.

Figure 8C:
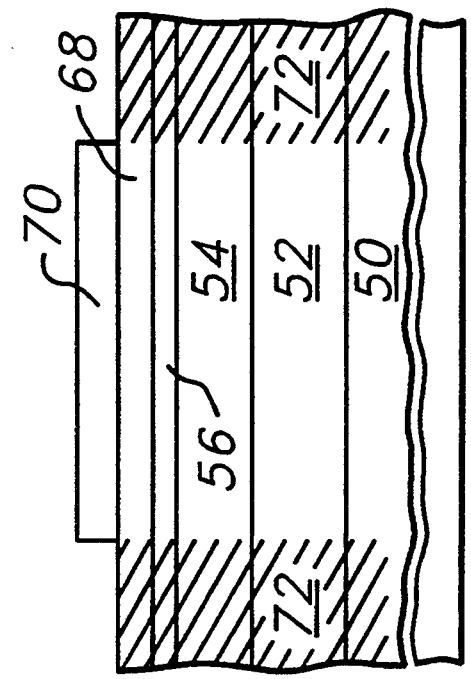

The Au mask 70 is removed and a layer 74 of WSi approximately 1000 Angstroms thick is deposited. Photoresist is deposited and patterned, and evaporation and liftoff of Ti/Pt/Au in thicknesses of 400, 400, and 2000 Angstroms, respectively is performed to define the emitter metallization 76 as shown in FIG. 8c.

Figure 8D:
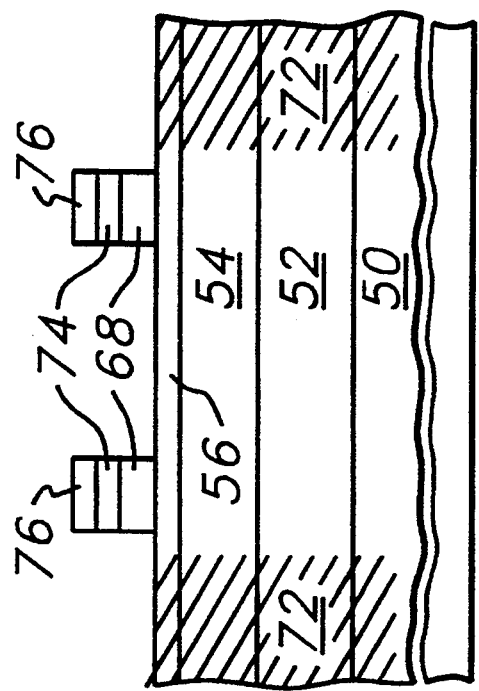

The emitter layer 68 is then etched in four steps to form emitter mesas under the emitter metallization 76. First, the WSi layer 74 is removed using the technique of Reactive Ion Etching (RIE) using $CF_4/O_2$ as the etchant. The InGaAs layers 62 and 64 are then removed using an $H_2SO_4$:$H_2O_2$:$H_2O$ (1:8:160 by volume) solution. Next, the GaAs buffer layer 66 is etched by RIE ($CCl_4$ as etchant), but the etch is stopped at the AlGaAs layers 60 and 58. RIE ($BCl_3$ as etchant) is then used to etch through layers 60 and 58, exposing the p+base layer 56. The resulting structure is shown in FIG. 8d.

Figure 8E:
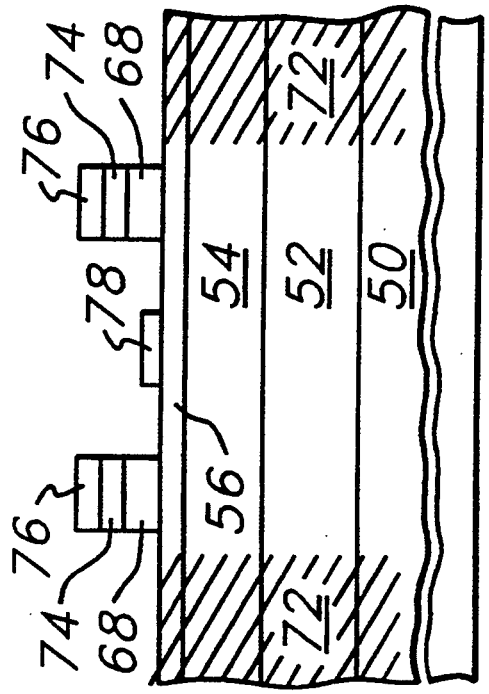
Figure 8F:
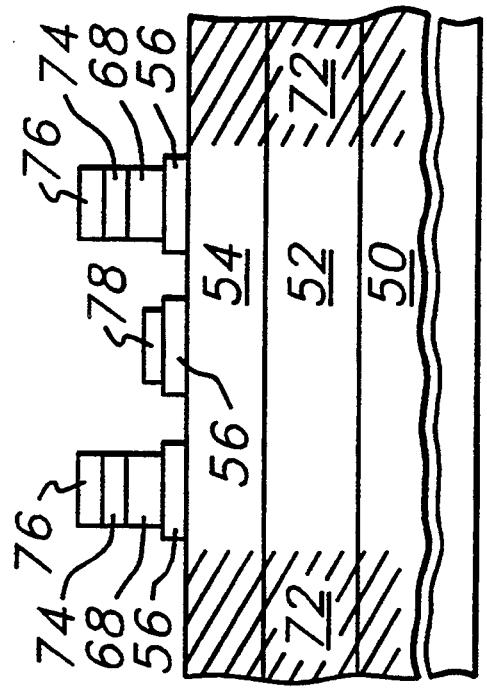

Base metallization 78 is deposited using evaporation and lift off of Ti/Pt/Au in thicknesses of 500, 150, and 2000 Angstroms, respectively. The resulting structure is shown in FIG. 8e. Base mesas are formed by patterning photoresist and then performing RIE (BCl$_3$ as etchant) removal of the p+ base layer 56. This exposes the n- collector layer 54 as shown in FIG. 8f.

Figure 10:
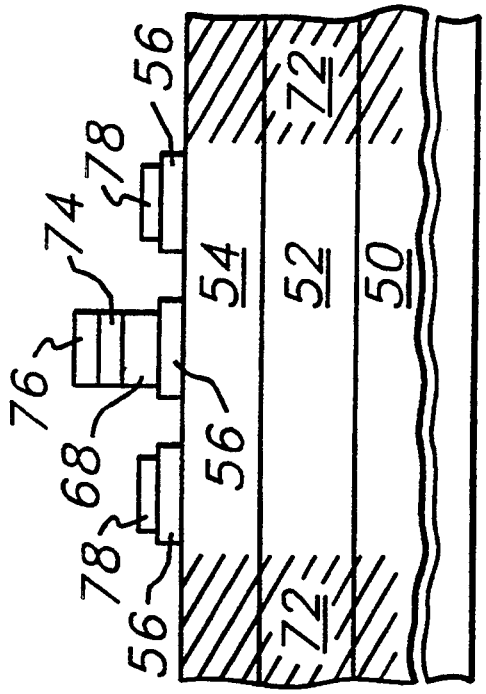
FIG. 10 is a cross-sectional view of a section of FIG. 9.
Figure 9:
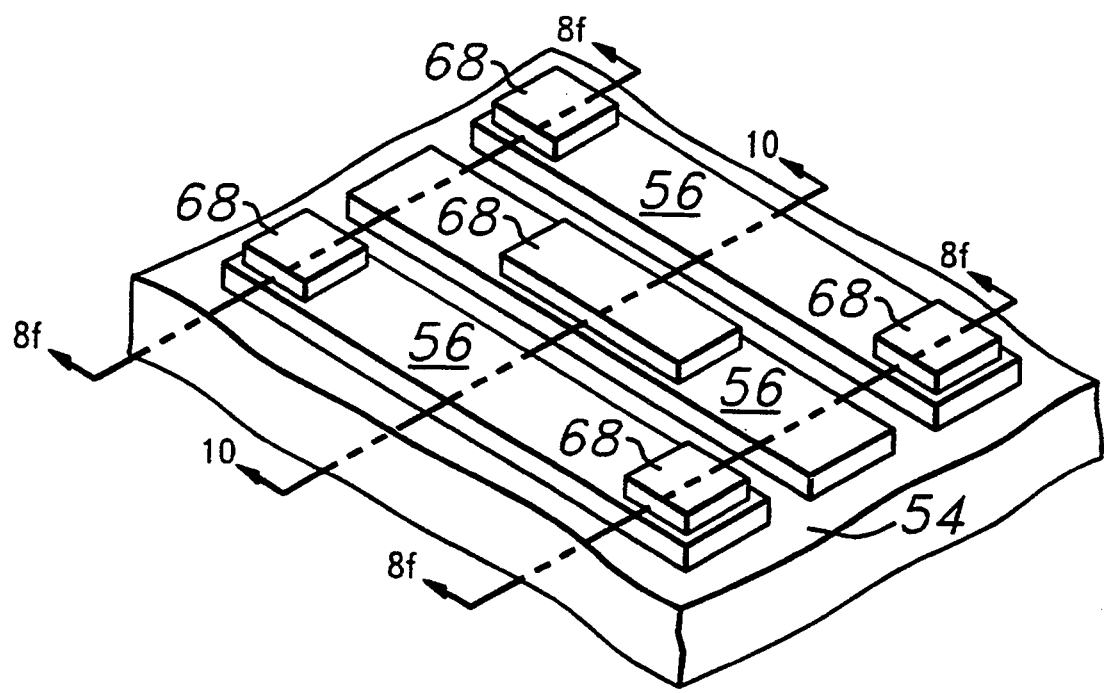
FIG. 9 is a perspective view of the first preferred embodiment device exclusive of base, emitter, and airbridge metallization.
Figure 11:
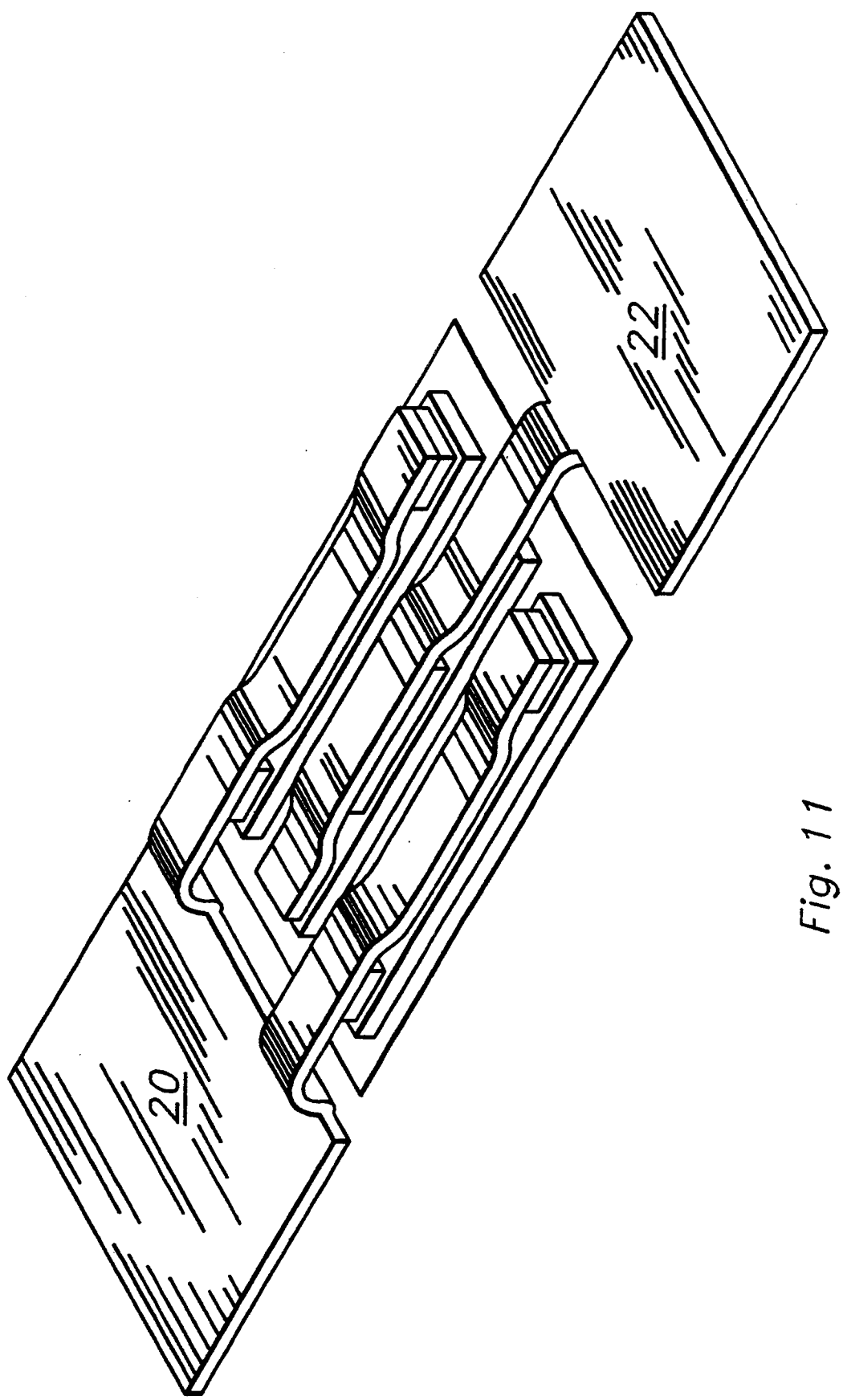
FIG. 11 is a perspective view of the first preferred embodiment device including airbridge metallization.
Figure 12:
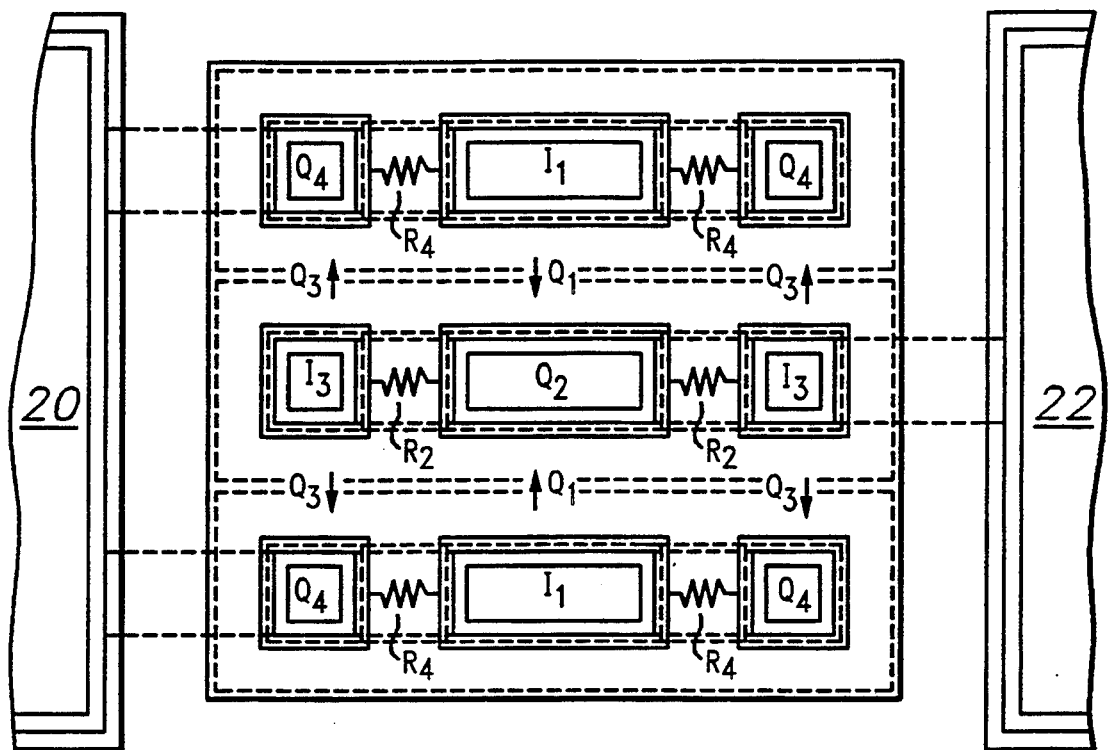
FIG. 12 is a plan view of the first preferred embodiment device showing element correlation with FIG. 1.

In order to form the circuit of the first preferred embodiment, an alternating pattern of base and emitter mesas is required, as shown in FIG. 9. FIG. 9 is a projection view of the first preferred embodiment circuit with all metallization removed for clarity. A cross-section of the center row of mesas shown in FIG. 9 is shown in FIG. 10. Comparison of FIG. 10 with FIG. 8f will make obvious the alternating mesa structure of the device. Provision for external contact to the circuit is provided by Au bond pads 20 and 22, or contact may be made directly to signal or DC lines incorporated as a part of .an integrated circuit including the first preferred embodiment circuit. Contact to the emitter and base metallization is achieved using a standard Au airbridge process. The structure, complete with airbridges and bond pads, but with emitter and base metallization not shown for clarity, is shown in FIG. 11, which corresponds to the embodiment circuit schematic shown in FIG. 1. A top view of FIG. 11, with element designations used in FIG. 1 is shown in FIG. 12 to indicate the location and distribution of transistors and resistors on the substrate. As is evident in FIG. 12, the NPN transistors are formed vertically from the emitter mesa structures. These transistors incorporate the wide-band-gap emitter layer 58, and are therefore true heterojunction transistors. The PNP transistors (Q1 and Q3), however, are formed laterally between adjacent base mesas, as denoted in FIG. 12. The base-emitter shunt resistors, R2 and R4, result from the intrinsic resistance of the p+ layer 56. In the preferred embodiment R2 is approximately 250 Ω, while R4 is 125 Ω. The values of R2 and R4 set the point at which the initial breakdown of the device occurs. Neglecting R2 and R4 would make the breakdown occur at a lower voltage than in the preferred embodiment devices.

Figure 13:
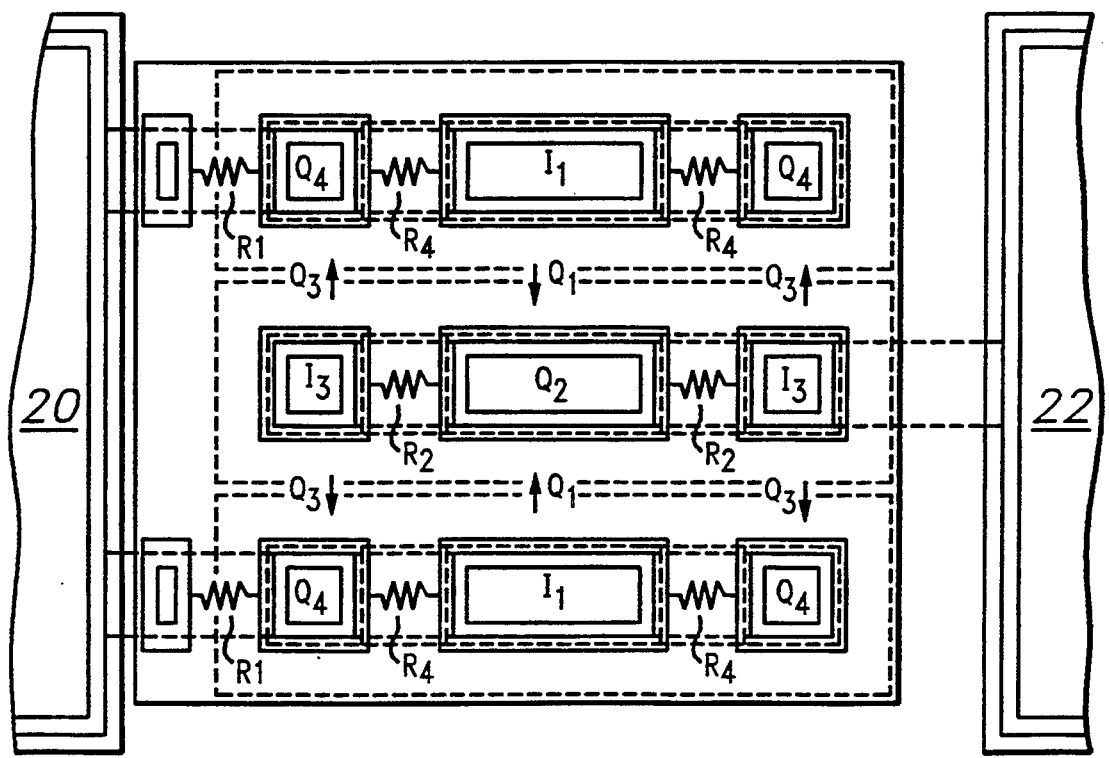
FIG. 13 is a plan view of the second preferred embodiment device layout.

Resistor R1 in the second preferred embodiment device is easily added to the layout of the first preferred embodiment and is shown in FIG. 13. A connection from the common collector of Q4 and base of Q3 (layer 54) to the metallization attached to bond pad 20 is required. Since collector layer 54 is lightly doped (8.0×10$^{15}$ atoms/cm$^3$), the resistivity is quite high. The bulk layer resistance will yield a resistor whose value can be in the range of 200 to 10000 Ω, depending on the size, number of contacts, and spacing distance between the collector layer contact and the p+ injector 13. It should be noted that the collector layer contact could also be located at the airbridge leading to the second bond pad 22 instead of the approach described above.

There are indications that the preferred embodiment devices do not function as does a conventional SCR (see, for example, S. M. Sze, *Physics of Semiconductor Devices*, Second Edition, Chapter 4), because in a standard SCR, a composite gain of unity is required of the two transistors comprising the SCR (Q1 and Q2 or Q3 and Q4 in this case). In this case, however, because of relatively inefficient PNP transistors (Q1 and Q3) compared to the NPN transistors (Q2 and Q4), the unity gain requirement is not met in the conventional manner. Reference to FIG. 2 shows that instead of the full "snapback" current-voltage characteristic of the prior art Si device shown in FIG. 4, the preferred embodiment device's current-voltage characteristics instead show a two-step "snapback" phenomenon. It appears that due to the aforementioned low PNP transistor gain, the trip and hold currents of the SCR action are much higher than conventional prior art SCRs. It is believed that as the current through the device increases, conductivity modulation in the n- collector layer 54 modifies the PNP transistor function to create an additional snapback at high currents. This might possibly occur because the PNP electrical base width is reduced causing the PNP gain to increase sufficiently to meet the unity gain requirement at a particular voltage and current. This result is surprising and possibly explains the lack of prior art electrostatic discharge devices that employ lateral PNP transistors (lateral PNP transistors are compatible with vertical NPN processing, but generally have a gain so low as to not give a gain product of unity when used with a vertical NPN transistor).

Figure 14:
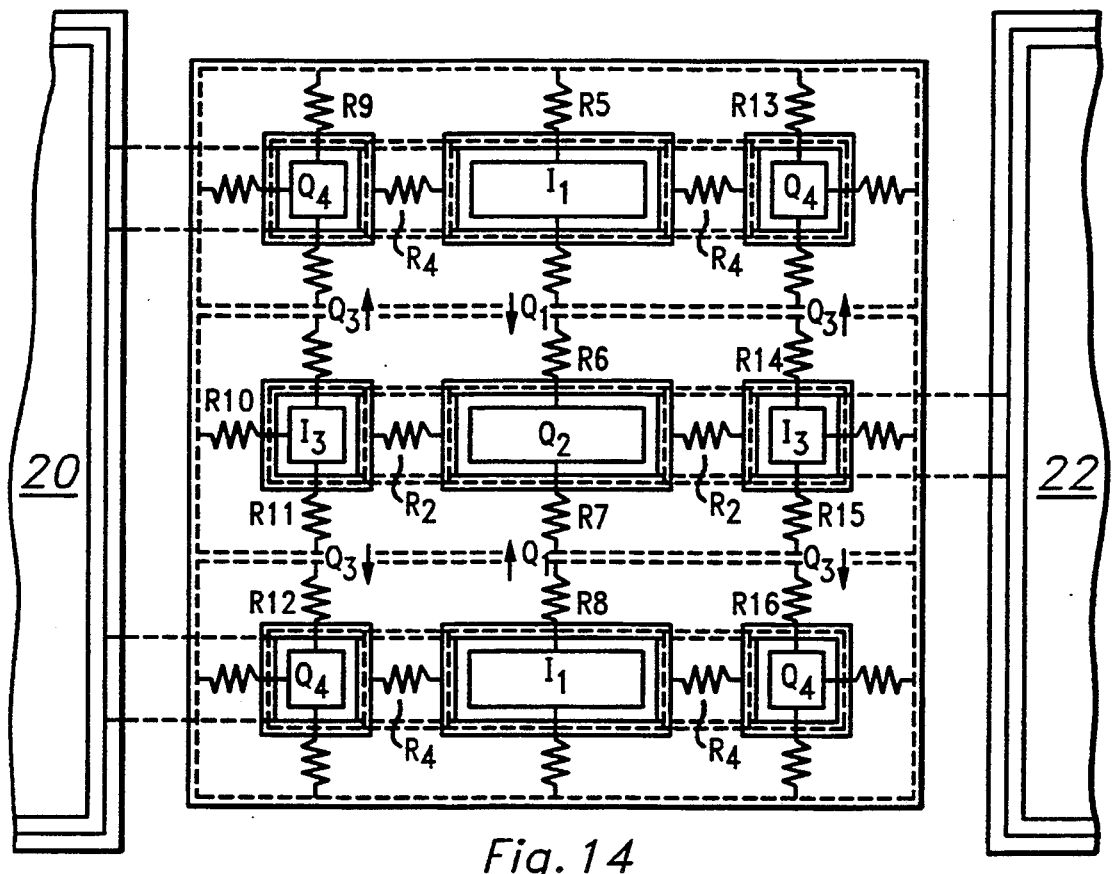
FIG. 14 is a plan view of the first preferred embodiment device showing the parasitic ballast resistors.
Figure 15:
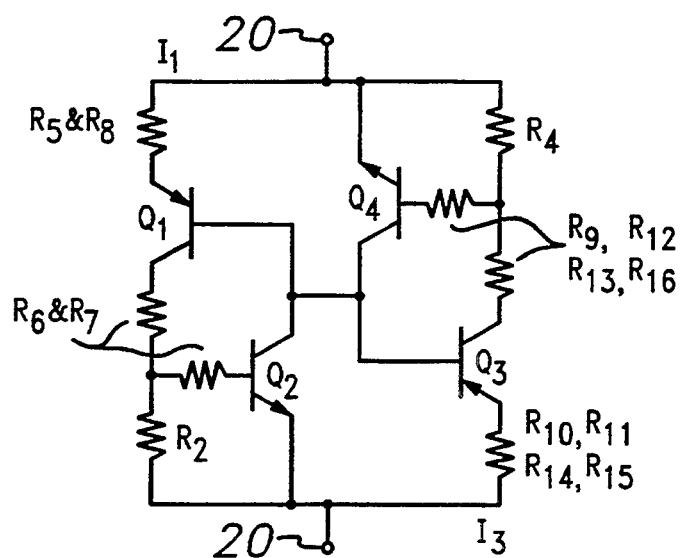
FIG. 15 is a schematic of the first preferred embodiment device showing the parasitic ballast resistors.

Resistive ballast techniques are used to help distribute the energy within each SCR. This is accomplished by controlling the spacing between the emitter mesa and the edge of the p+ base mesa as well as the spacing between the p+ injector contact and the edge of the p+ mesa. In this particular design, 4 μm spacing was used for both spacings, though a spacing in the range from 5 μm to about 1 μm may be used. This then adds resistance in series with the injector and in series with the collector of the PNP, or base of the NPN. These ballast resistors are represented by the parasitic distributed resistors R5 through R16 shown in FIG. 14. These resistors are important in setting the maximum peak energy that the protection device can tolerate. The key is that no one area or corner of the structure be allowed to "hog" a disproportionate amount of the total current. If current should for some reason increase at a localized area because of, for example, a defect, the resistive heating of the semiconductor "resistor" will cause its resistance to increase in the area of the defect, thereby redistributing the current to lower resistance paths around the entire structure. It can be seen from FIG. 14 that the ballast resistors are distributed along the periphery of the emitters of Q2 and Q4 as well as the injectors I1 and I3. These resistors are shown schematically in FIG. 15.

A third preferred embodiment device is that of two stacked, or serially linked, first or second preferred embodiment devices. By placing two serially connected first or second preferred embodiment devices between a signal or DC line and ground, double the voltage capability for a given ESD energy level can be achieved. Additionally, first or second preferred embodiment devices can continue to be stacked until the stack's turn-on voltage exceeds the breakdown voltage of the device being protected. This allows large voltage swings at the input of the device without the protected device being endangered by overstress.

A few preferred embodiments have been described in detail hereinabove. It is to be understood that the scope of the invention also comprehends embodiments different from those described, yet within the scope of the claims.

Internal and external connections can be ohmic, capacitive, direct or indirect, via intervening circuits or otherwise. Implementation is contemplated in discrete components or fully integrated circuits in gallium arsenide, and other electronic materials families, as well as in optical-based or other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A protection circuit comprising:
   a first terminal contact;
   an NPN heterojunction bipolar transistor;
   a PNP bipolar transistor;
   a base-emitter shunt resistor;
   an emitter of said PNP transistor connected to said first terminal contact;
   a base of said PNP transistor connected to a collector of said NPN transistor;
   a collector of said PNP transistor connected to a base of said NPN transistor; and
   an emitter of said NPN transistor connected to a second terminal contact, with said base-emitter shunt resistor connected between said base of said NPN transistor and an emitter of said NPN transistor.

2. The circuit of claim 1 wherein said NPN heterojunction bipolar transistor comprises GaAs collector and base layers and an AlGaAs emitter layer.

3. The circuit of claim 1 wherein said PNP bipolar transistor comprises two mesas made of a highly doped p-type base layer, and wherein said mesas are connected by a lightly doped n-type collector layer lying beneath and between said mesas.

4. The circuit of claim 1 wherein said base-emitter shunt resistor is formed of highly doped p-type GaAs.

5. A circuit comprising:
   a first terminal contact;
   a first heterojunction bipolar transistor; and
   a first bipolar transistor;
   wherein an emitter of said first bipolar transistor is connected to said first terminal contact;
   a base of said first bipolar transistor is connected to a collector of said first heterojunction bipolar transistor;
   a collector of said first bipolar transistor is connected to a base of said first heterojunction bipolar transistor;
   an emitter of said first heterojunction bipolar transistor is connected to a second terminal contact; and
   a second heterojunction bipolar transistor; and
   a second bipolar transistor;
   wherein an emitter of said second bipolar transistor is connected to said second terminal contact;
   a base of said second bipolar transistor is connected to a collector of said second heterojunction bipolar transistor; and
   a collector of said second bipolar transistor is connected to said base of said second heterojunction bipolar transistor, with said emitter of said second heterojunction bipolar transistor connected to said first terminal contact, and with said connected base of said first bipolar transistor and collector of said first heterojunction bipolar transistor connected to said connected base of said second bipolar transistor and collector of said second heterojunction bipolar transistor.

6. The circuit of claim 5 wherein said heterojunction bipolar transistors are NPN and comprise GaAs collector and base layers and an AlGaAs emitter layer.

7. The circuit of claim 5 wherein said bipolar transistors comprise two mesas made of a highly doped p-type base layer and said mesas are connected by a lightly doped n-type collector layer lying beneath and between said mesas.

8. The circuit of claim 5 further comprising a first base-emitter shunt resistor connected between said base and said emitter of said first heterojunction bipolar transistor and a second base-emitter shunt resistor connected between said base and said emitter of said second heterojunction bipolar transistor.

9. A circuit comprising:
   a first terminal contact;
   a first NPN heterojunction bipolar transistor;
   a first PNP bipolar transistor; and
   a first base-emitter shunt resistor;
   wherein an emitter of said first PNP transistor is connected to said first terminal contact;
   a base of said first PNP transistor is connected to a collector of said first NPN transistor;
   a collector of said first PNP transistor is connected to a base of said first NPN transistor;
   an emitter of said first NPN transistor is connected to a second terminal contact; and
   said first base-emitter shunt resistor is connected between said base and said emitter of said first NPN transistor; and
   a second NPN heterojunction bipolar transistor;
   a second PNP bipolar transistor; and
   a second base-emitter shunt resistor;
   wherein an emitter of said second PNP transistor is connected to said second terminal contact;
   a base of said second PNP transistor is connected to a collector of said second NPN transistor;
   a collector of said second PNP transistor is connected to said base of said second NPN transistor, with said emitter of said second NPN transistor connected to said first terminal contact, and with said second base-emitter shunt resistor connected between said base and said emitter of said second NPN transistor, and with said connected base of said first PNP transistor and collector of said first NPN transistor connected through a node to said connected base of said second PNP transistor and collector of said second NPN transistor.

10. The circuit of claim 9 wherein said NPN heterojunction bipolar transistors comprise GaAs collector and base layers and an AlGaAs emitter layer.

11. The circuit of claim 9 wherein said PNP bipolar transistors comprise two mesas made of a highly doped p-type base layer and said mesas are connected by a lightly doped n-type collector layer lying beneath and between said mesas.

12. The Electrostatic Discharge protection device of claim 9 further comprising a bypass resistor, wherein said bypass resistor is connected between said first terminal contact and said node.

13. An integrated circuit including:
   an electrostatic discharge protection circuit comprising:
      a first terminal contact;
      a heterojunction bipolar transistor;
      a bipolar transistor;
      wherein an emitter of said bipolar transistor is coupled to said first terminal contact;

a base of said bipolar transistor is coupled to a collector of said heterojunction bipolar transistor;

a collector of said bipolar transistor is coupled to a base of said heterojunction bipolar transistor;

an emitter of said heterojunction bipolar transistor is coupled to a second terminal contact; and said base of said heterojunction bipolar transistor is coupled to said emitter of said heterojunction bipolar transistor, and a circuit to be protected from electrostatic discharge, wherein said protection circuit is connected in shunt with said circuit to be protected, and further wherein said protection circuit and said circuit to be protected are disposed upon a monolithic substrate.

14. The integrated circuit of claim 13 wherein said monolithic substrate is GaAs.

15. The integrated circuit of claim 13 wherein said heterojunction bipolar transistor is NPN and comprises GaAs collector and base layers and an AlGaAs emitter layer.

16. An integrated circuit including:
an electrostatic discharge protection circuit comprising:
a first terminal contact;
at least first and second heterojunction bipolar transistors, each heterojunction bipolar transistor having an emitter, a base, and a collector; and
a first and a second bipolar transistor, each bipolar transistor having an emitter, a base, and a collector;
wherein said emitter of said first bipolar transistor is connected to said first terminal contact, and said base of said first bipolar transistor is connected to said collector of said first heterojunction bipolar transistor, said collector of said first bipolar transistor is connected to said base of said first heterojunction bipolar transistor, and said emitter of said first heterojunction bipolar transistor is connected to a second terminal contact and
further wherein said emitter of said second bipolar transistor is connected to said second terminal contact, said base of said second bipolar transistor is connected to said collector of said second heterojunction bipolar transistor, said collector of said second bipolar transistor is connected to said base of said second heterojunction bipolar transistor, said emitter of said second heterojunction bipolar transistor is connected to said first terminal contact, said connected base of said first bipolar transistor and collector of said first heterojunction bipolar transistor is connected to said connected base of said second heterojunction bipolar transistor and collector of said second heterojunction bipolar transistor; and
circuitry to be protected from electrostatic discharge wherein said protection circuit is connected in shunt with said circuitry to be protected; and further wherein said protection circuit and said circuitry to be protected are disposed upon a monolithic substrate.

17. The integrated circuit of claim 16 wherein said monolithic substrate is GaAs.

18. The integrated circuit of claim 16 wherein said heterojunction bipolar transistors are NPN, and comprise GaAs collector and base layers and an AlGaAs emitter layer.

19. The integrated circuit of claim 16 wherein said bipolar transistors are PNP and comprise two mesas made of a highly doped p-type base layer and wherein said mesas are connected by a lightly doped n-type collector layer lying beneath and between said mesas.

20. The integrated circuit of claim 16 further comprising a first base-emitter shunt resistor connected between said base and said emitter of said first heterojunction bipolar transistor, and a second base-emitter shunt resistor connected between said base and said emitter of said second heterojunction bipolar transistor.

21. An integrated circuit including:
an electrostatic discharge protection circuit comprising:
a first terminal contact;
at least first and second NPN heterojunction bipolar transistors, each NPN heterojunction bipolar transistor having an emitter, a base, and a collector;
a first and a second PNP bipolar transistor, each PNP bipolar transistor having an emitter, a base, and a collector; and
a first base-emitter shunt resistor;
wherein said emitter of said first PNP transistor is connected to said first terminal contact, said base of said first PNP transistor is connected to said collector of said first NPN transistor, said collector of said first PNP transistor is connected to said base of said first NPN transistor, said emitter of said first NPN transistor is connected to a second terminal contact, and said first base-emitter shunt resistor is connected between said base and said emitter of said first NPN transistor;
a second base-emitter shunt resistor, wherein said emitter of said second PNP transistor is connected to said second terminal contact, said base of said second PNP transistor is connected to said collector of said second NPN transistor, said collector of said second PNP transistor is connected to said base of said second NPN transistor, said emitter of said second NPN transistor is connected to said first terminal contact, said second base-emitter shunt resistor is connected between said base and said emitter of said second NPN transistor, said connected base of said first PNP transistor and collector of said first NPN transistor is connected through a node to said connected base of said second PNP transistor and collector of said second NPN transistor; and
circuitry to be protected from electrostatic discharge, wherein said protection circuit is connected in shunt with said circuitry to be protected; and further wherein said protection circuit and said circuitry to be protected are disposed upon a monolithic substrate.

22. The integrated circuit of claim 21 wherein said monolithic substrate is GaAs.

23. The integrated circuit of claim 21 wherein said NPN heterojunction bipolar transistors comprise GaAs collector and base layers and an AlGaAs emitter layer.

24. The integrated circuit of claim 21 wherein said PNP bipolar transistors two mesas made of a highly doped p-type base layer, wherein said mesas are connected by a lightly doped n-type collector layer lying beneath and between said mesas.

25. The integrated circuit of claim 21 further comprising a bypass resistor, wherein said bypass resistor is connected between said first terminal contact and said node.

26. A method for making an Electrostatic Discharge protection device comprising the steps of:
   providing a material structure including:
      a substrate;
      a subcollector layer formed over said substrate;
      a collector layer formed over said subcollector layer;
      a base layer formed over said collector layer;
      an emitter layer having a bandgap wider than said base layer formed over said base layer;
   removing portions of said layers to form a heterojunction bipolar transistor, a bipolar transistor, and a base-emitter shunt resistor, wherein a base of said bipolar transistor is connected to a collector of said heterojunction bipolar transistor, and wherein a collector of said bipolar transistor is connected to a base of said heterojunction bipolar transistor; and
   forming metallization to connect an emitter of said bipolar transistor to a first terminal contact, to connect an emitter of said heterojunction bipolar transistor to a second terminal contact, and to connect said base-emitter shunt resistor between said base and said emitter of said heterojunction bipolar transistor.

27. The method of claim 26 wherein said substrate is GaAs.

28. The method of claim 27 wherein said subcollector, collector, and base layers are GaAs.

29. The method of claim 28 wherein said emitter layer is AlGaAs.

* * * * *